United States Patent
Mahoney et al.

(10) Patent No.: US 6,432,260 B1
(45) Date of Patent: Aug. 13, 2002

(54) INDUCTIVELY COUPLED RING-PLASMA SOURCE APPARATUS FOR PROCESSING GASES AND MATERIALS AND METHOD THEREOF

(75) Inventors: Leonard J. Mahoney; Gregory A. Roche; Daniel C. Carter, all of Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 09/633,310

(22) Filed: Aug. 7, 2000

Related U.S. Application Data

(60) Provisional application No. 60/147,638, filed on Aug. 6, 1999.

(51) Int. Cl.[7] .............................. C23F 1/02; C23C 14/34; C23C 16/00
(52) U.S. Cl. .............................. 156/345.35; 156/345.38; 156/345.48; 156/345.49; 118/723 MP; 118/723 E; 118/723 I; 118/723 IR; 118/723 AN; 315/111.51; 204/298.06; 204/298.07; 204/298.16; 204/298.31; 204/298.33; 204/298.34
(58) Field of Search .............. 315/111.51; 118/723 MP, 118/723 E, 723 I, 723 IR, 723 AN; 156/345, 345.35, 345.38, 345.48, 345.49; 204/298.06, 298.07, 298.16, 298.31, 298.33, 298.34

(56) References Cited

U.S. PATENT DOCUMENTS

| | | | |
|---|---|---|---|
| 3,015,745 A | * 1/1962 | Klein | 313/363.1 |
| 3,291,715 A | * 12/1966 | Anderson | 204/298.06 |
| 4,431,898 A | * 2/1984 | Reinberg et al. | 219/121.23 |
| 5,998,933 A | * 12/1999 | Shun'ko | 315/111.51 |
| 6,150,628 A | * 11/2000 | Smith et al. | 219/121.54 |

* cited by examiner

Primary Examiner—Rodney G. McDonald
(74) Attorney, Agent, or Firm—Benjamin Hudson, Jr.

(57) ABSTRACT

There is provided by this invention a novel inductively coupled plasma source apparatus that utilizes a transformer to induce closed path secondary plasma currents in a hollow metal housing that is directly cooled by a fluid. This plasma source apparatus is particularly useful for generating a high charged particle density source of ions, electrons, and chemically active species to serve various plasma related processes that may require high power densities. A hollow metal vacuum chamber is coupled to and electrically insulated from a metal vacuum process chamber by means of dielectric gaps that are well shielded from direct exposure to the plasma body. Electrons, photons and excited gaseous species are generated within the metal hollow chamber and process chamber to serve a wide variety of material, surface and gas processing applications. There is also provided by this invention a means of ganging together several hollow metal vacuum chamber assemblies about a single vacuum process chamber.

58 Claims, 12 Drawing Sheets

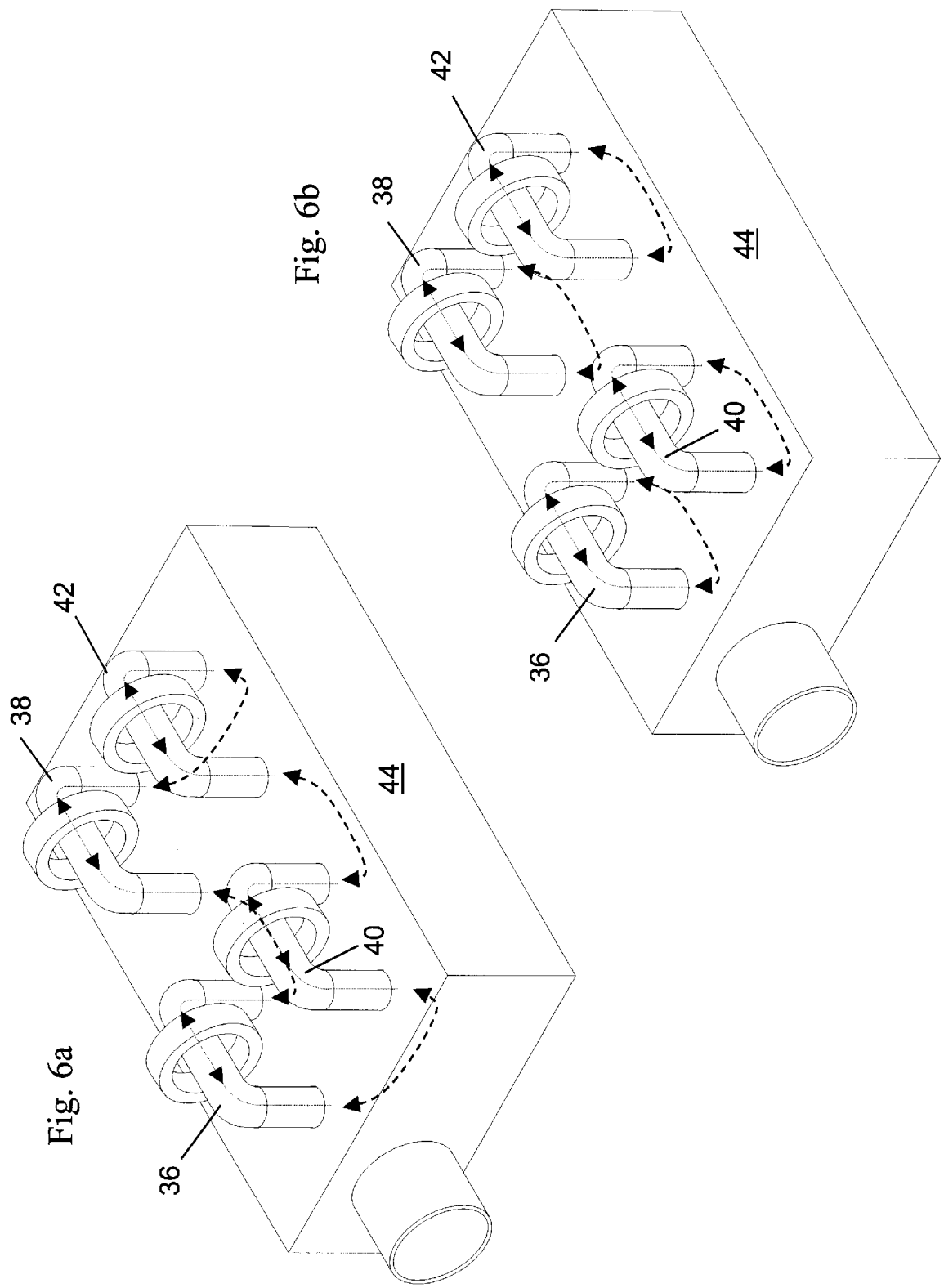

INDUCTIVELY COUPLED RING-PLASMA SOURCE APPARATUS FOR PROCESSING GASES AND MATERIALS AND METHOD THEREOF

RELATED APPLICATIONS

This application is related to and claims the benefit of the commonly assigned provision application Ser. No. 60/147,638 filed Aug. 6, 1999 the contents of which are incorporated herein by reference.

BACKGROUND OF THE INVENTION

1. Field of the Invention

This invention relates to a plasma source apparatus and method by which to produce a high power density gaseous plasma discharge within a nearly all-metal, fluid cooled vacuum chamber by means of an inductively coupled RF power means. The invention is particularly useful for generating a high charged particle density source of ions and electrons with either chemically inert or reactive working gases for processing materials.

2. Brief Description of the Prior Art

Numerous forms of inductively coupled plasma (ICP) sources or transformer coupled plasma (TCP) sources have been described along with their applications to materials processing. These devices make use of at least one induction coil element disposed in close proximity to, around or within a vacuum chamber that is excited with RF power. Electromagnetic fields about the induction coils sustain a gas plasma discharge within the vacuum apparatus and induce RF electron drift currents within the plasma. In addition to the RF induction coils, auxiliary DC or AC magnetic fields and Faraday shields may also be imposed on the ICP or TCP apparatus so as to enhance RF heating or spatial properties of the gas plasma discharge. References have disclosed unique design embodiments of the induction coils, the application of Faraday shields to reduce electrostatic coupling from high voltages on the coils, RF coupling and impedance matching techniques to the ICP source, and unique embodiments that improve the RF electron heating and spatial uniformity of the plasma.

In those instances where the induction coil is not immersed within the vacuum, the RF fields are coupled to the plasma discharge through a ridged dielectric vacuum wall. The plasma discharge body formed by various ICP sources can be closely coupled to a materials processing vacuum region to facilitate surface treatment, material etching, sputter deposition, chemical vapor deposition, and other related vacuum based operations. In other applications it is desirable to remotely couple ICP sources to process vacuum systems in order to generate heated, reactive gaseous species which then flow into the materials processing vacuum region or system to enhance etching or deposition processes and to facilitate chamber and vacuum component surface cleaning. This latter application may require a high plasma density state that is commonly associated with an ICP source in the presence of high gas flows several hundreds of standard cubic centimeters per minute (sccm) and with plasma discharge pressure vacuum pressures greater than several hundreds of milliTorr.

The following references are indicative of inductively coupled plasma sources used in materials processing applications:

U.S. Pat. No. 4,065,369, Ogawa et al., Dec. 27, 1977
U.S. Pat. No. 4,368,092, Steinberg et al., Jan. 11, 1983
U.S. Pat. No. 4,431,898, Reignberg et al., Feb. 14, 1984
U.S. Pat. No. 4,948,458, Ogle, Aug. 14, 1990
U.S. Pat. No. 5,008,593, Schilie et al., Apr. 16, 1991
U.S. Pat. No. 5,280,154, Cuomo et al., Jan. 18, 1994
U.S. Pat. No. 5,397,962, Moslehi, Mar. 14, 1995
U.S. Pat. No. 5,534,231, Keller et al., Jul. 9, 1996

There are several shortcomings of the prior art methods for producing inductively coupled plasma for many applications. In particular, these sources which use non-conductive dielectric (i.e. fused-quartz, glass, alumina, sapphire, aluminum nitride, or boron nitride) walls to separate the induction coil(s) from the plasma discharge body can limit range of the power density (Watts per cubic centimeter) disposed through the dielectric wall and into the process plasma discharge. These dielectric vacuum wall materials pass the RF fields into the vacuum plasma discharge. They are then selected and applied on the basis of their chemical compatibility with the reactive plasma discharge byproducts, thermal-mechanical resilience, and UV transmission properties. However, at higher pressures and power densities, the restrictions of collisional, ambipolar diffusion of ions and electrons results in a spatial constriction of the plasma discharge within the vacuum chamber, and often in close proximity to the induction coil current carrying elements. In such cases the heated plasma discharge gases readily transfer thermal energy to the wall in close proximity to the induction coil as disposed about the plasma source. The localized thermal flux from the plasma gases can be so high and localized that the plasma discharge may damage the dielectric materials by means of thermally enhanced chemical erosion, thermally induced mechanical stresses, or even softening and melting as in the case of fused quartz or glass. Moreover, the spatial constriction of the diffusive plasma body can result in a lower coupling efficiency from the primary induction coils to the gas plasma discharge.

In order to accommodate these dielectric materials under high power density conditions, special fluid cooling measures such as forced air cooling or circulating liquid coolants in direct or near contact to the dielectric vacuum wall is required to extract waste heat from the plasma apparatus. Exemplary of this approach are Schile et al. in U.S. Pat. No. 5,008,593, Holber et al. in U.S. Pat. No. 5,568,015, and Shang et al. in U.S. Pat. No. 5,892,328. The inclusion of fluid cooling measures directly on the dielectric vacuum plasma discharge walls can make the design of the source complicated and expensive and can reduce the coupling efficiency of RF or microwave power to the plasma. Also, direct water cooling of the dielectric wall can incur high operational risks because air or water can readily leak into the vacuum based process should the dielectric wall be cracked or damaged when mechanically or thermally shocked or when under cooled.

In some cases, workers can avoid the problems with the high power density inductively coupled state at high pressures and power by operating ICP plasma discharge apparatus in a substantially weaker plasma density, capacitively coupled state. In this lower plasma density state, the plasma discharge is driven by sheath electron heating through the spatially distributed quasi-static electric fields from the RF voltage on the induction coil rather than through induced electric fields associated with the RF currents on the induction coil. Unfortunately, the capacitively coupled state of conventional ICP sources does not support the high excitation, ionization, and molecular dissociation levels as desired from the inductively coupled state of an ICP source.

Most existing ICP and TCP sources are limited in their scale, power range and pressure range of operation due to the following:

1. extensive use of dielectric vacuum wall materials and their common thermal mechanical constraints when used in high power density, chemically reactive and ultraviolet light emitting plasma applications;

2. low coupling efficiency within non-immersed coil ICP source designs (<0.5 typically) due to spatial design constraints between induction coils and this plasma discharge body;

3. constraints in cooling dielectric vacuum walls, vacuum seals, vacuum power feedthroughs, and induction coil elements in high power density applications; and 4. RF quasi-electrostatic fields on the coil and within the plasma as driven by the induction coil elements and the need for Faraday shields and fluid cooling means with high AC voltage standoff ratings.

Relevant to the background of this invention is an alternative means of producing an inductively coupled plasma discharge using a ferrite transformer core such that the conductive gas plasma discharge works as a single turn secondary winding about the ferrite core. This method has been described by Anderson in U.S. Pat. No. 3,500,118, U.S. Pat. No. 3,987,334, and U.S. Pat. No. 4,180,763 for lighting applications and by Reinberg et al. in U.S. Pat. No. 4,431,898 for plasma resist strip applications. These references describe how at least one ferrite core disposed about a closed path, topologically toroidal shaped dielectric vacuum chamber or chamber embodiment may be driven at RF frequencies to induce a topologically solenoidal shaped electric field and, thereby, toroidal a gas plasma discharge within the chamber. In this apparatus the plasma discharge acts as a single turn secondary current linked ferrite core with good coupling efficiency. The electron drift currents induced in the plasma flow along the closed path of the topologically toroidal volume defined by or in communication with a vacuum chamber. However, the materials used in the examples of such devices are dielectrics (i.e. fused-quartz, pyrex, nonconducive glass, alumina, sapphire, boron nitride, ceramic or heat resistant plastic materials). For the thermal management reasons noted above, these dielectric materials and vacuum walls are not well suited to applications employing very high power densities when flowing chemically reactive process gases (e.g. fluorine-bearing gases) through a vacuum chamber or other processing chamber.

Also the discussions from existing references provide no teaching as to how apparatuses using torodial shaped, transformer coupled means may be adapted to facilitate processes that require effective thermal management of its elements. For example if one were to alter the invention described by Reinberg, et al. in U.S. Pat. No. 4,431,898 by using a water-cooled conductive metal for the "tubing means to define a continuous open path about an opening" through a plasma chamber, the device would not work. Rather, one would couple currents onto the conductive metal body and no plasma would form within the vacuum chamber as described by Reinberg et al.

OBJECT OF THE INVENTION

It is the objective of this invention to provide an inductively coupled plasma source apparatus that may be applied to material processing applications and that does not make principal use of primary induction coil elements that are either (1) separated from the plasma discharge by a dielectric vacuum wall or (2) are immersed within the vacuum plasma discharge. It is also the objective of this invention to have an inductively coupled plasma source that has a high coupling coefficient between the primary induction coils and the induced secondary plasma currents within a plasma discharge body that is predominantly surrounded by vacuum boundaries that can be directly cooled with a fluid. These vacuum boundaries can be selected and designed so as to be chemically compatible with reactive process gases of a high power density plasma environment. It is further the objective of this invention to provide a scalable inductively coupled plasma source apparatus which may be well cooled so as to be reliably and continuously operated over a broad range of vacuum pressure, power densities, chemistries and RF frequencies.

SUMMARY OF THE INVENTION

There is provided by this invention an inductively coupled plasma source apparatus and method. The apparatus utilizes at least one ferrite transformer core to induce closed path electron RF electron drift currents within a plasma body surrounded by a fluid-cooled hollow metal vacuum chamber. This hollow metal vacuum chamber is coupled to and electrically insulated from a metal vacuum process chamber by means of at least two orifices and dielectric gaps which are well shielded from direct exposure to the plasma body. By this means a gaseous plasma discharge is driven within an all metal hollow vacuum chamber core in such manner that the closed path RF currents are extended into said metal vacuum process chamber to form a diffusive plasma within said metal vacuum process chamber. Electrons, photons and excited gaseous species are generated within the metal hollow chamber and process chamber to serve a wide variety of material, surface and gas processing applications. This plasma source apparatus is particularly useful for generating a high chargedparticle density source of ions, electrons, and chemically active species to serve various plasma related processes that may require high power densities.

The hollow metal vacuum chamber is fluid cooled in order to remove waste heat from the plasma discharge-based process. An electrostatic element within the hollow metal vacuum chamber or vacuum process chamber is provided which is capable of forming an electric field of sufficient strength to electrically break down the gas and ignite the plasma.

This invention teaches grouping or ganging together several hollow metal vacuum chamber assemblies about a single vacuum process chamber to achieve desired plasma properties related to power, plasma density, spatial plasma formation and distribution for scaling to large areas, and excited plasma chemistry and spatial dispersion. The design and control of such plasma properties can be necessary to achieve various material process objectives.

BRIEF DESCRIPTION OF DRAWINGS

FIG. 6(a) illustrates an inductively coupled plasma source apparatus utilizing multiple transformer cores and fluid-cooled hollow metal vacuum chambers that are disposed in an array and that are electrically driven in series to form a continuous circulating plasma currents for processing board surface areas;

FIG. 6(b) illustrates an inductively coupled plasma source apparatus utilizing multiple transformer cores and fluid-cooled hollow metal vacuum chambers that are disposed in an array and that are electrically driven in parallel to form a continuous circulating plasma currents for processing board surface areas;

DETAILED DESCRIPTION OF THE INVENTION

This invention relates to a plasma source apparatus for producing a high power density and high charged-particle density gaseous plasma discharge and to process methods including, but not limited to, etching, deposition and surface treatment of materials. The apparatus uses at least one ferrite transformer core to inductively couple AC power into a plasma discharge body that is nearly fully enclosed by a hollow metal vacuum chamber that is open at both ends. The hollow metal vacuum chamber is in communication with a primary vacuum process chamber or region by means of dielectric insulators or gaps. AC current is applied to the primary winding of the transformer core in order to form closed path plasma electron drift currents within the vacuum regions surrounded by the hollow metal vacuum chamber, dielectric insulators, and vacuum process chamber.

Figure 1:
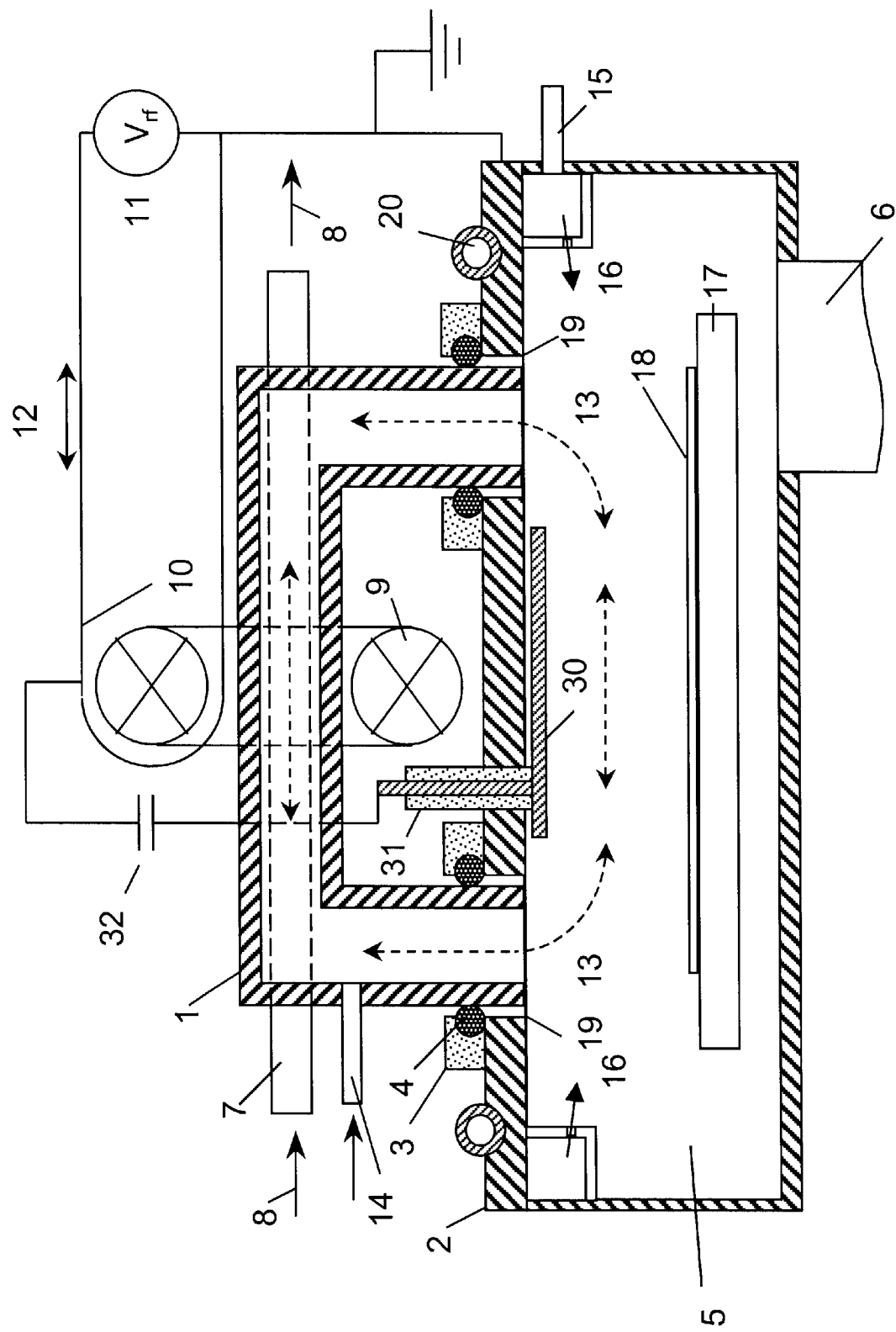
FIG. 1 illustrates an inductively coupled plasma source apparatus utilizing a single transformer core, a fluid-cooled hollow metal vacuum chamber, a vacuum process chamber and embodiments.

In view of the foregoing FIG. 1 illustrates the basic elements of the invention. The apparatus includes a hollow metal hollow metal vacuum chamber 1 that is open at each of its two ends. This hollow vacuum chamber is coupled at its ends to a metal vacuum process chamber 2 by means of dielectric insulators 3 and compression vacuum seals 4. The vacuum process chamber 2 encloses a vacuum process region 5 that is pumped through a vacuum port 6. A channel 7 through which a cooling fluid 8 such as chilled water is allowed to flow cools the hollow metal vacuum chamber 1. The fluid cooling channel 7 need not pass through the transformer core. Any number of cooling paths about the hollow metal vacuum chamber could be used. An air core or ferrite transformer core 9 is wrapped about the vacuum chamber so as to impart electromagnetic energy to the vacuum chamber body. Primary windings 10 are wrapped about ferrite core and an AC power source 11 is applied to drive a current 12 on the primary winding. In the presence of a gas plasma discharge within the vacuum chamber, a closed path AC electron drift current distribution 13 is induced as a secondary current to the transformer 9. The induced electron currents sustain a gas plasma discharge within the vacuum process region 5. As with the hollow metal vacuum chamber 1, the vacuum process chamber 2 may be fluid cooled by means of additional cooling channels 20 to extract thermal energy from the walls of the system.

Working gases may be introduced into the apparatus by input gas port 14 in communication with vacuum chamber 1 or alternatively by input port 15 in communication with a gas distribution ring 16 and vacuum chamber 2. These working gases are excited by the plasma discharge and are allowed to diffuse to work piece holder 17 on which is mounted a work piece 18. This holder 17 may be electrically biased (DC or RF) as appropriate to serve conventional plasma assisted processing techniques for etching, deposition or surface treatment of work piece 18.

As with many inductively coupled plasma source devices, the induced electromagnetic fields are not strong enough to initially breakdown the working gases, or ignite the plasma discharge. The electrical breakdown or ignition event is typically initiated by means of a high strength static or quasi-static electric field in communication with the working gases in the partial vacuum. In this apparatus, the plasma discharge may be ignited by quasi-static electric fields that may be driven between the hollow metal vacuum chamber 1 and the vacuum chamber 2 at the electrically isolating gaps 19. When the AC power is applied, the leakage capacitance between the primary winding 10 and the hollow metal vacuum chamber 1 can be used to couple an AC voltage onto the metal vacuum chamber. Provided that the gap spacings are of particular mean width, the high strength electric field that results within the gap may be capable of igniting the plasma discharge and thereby generate a local RF glow discharge in the proximity of each gap.

Alternatively, a capacitive electrode 30 attached through a vacuum electrical feed through 31 can be powered through a capacitive connection 32 to the AC power source. Electrode 30 is placed in relative close proximity to the grounded chamber 2. When a high AC voltage and current is applied to primary winding 10, a relatively high voltage is also applied in the internal electrode 30. With sufficient background chamber pressure, the high effective electric field sustained between the internal electrode 30 and chamber 2 can be used to ignite the plasma discharge. It is also possible to place a pulsed low capacitance switch between 10 and 32 so as to reduce the time-averaged quasi-electrostatic potential, current and power disposed to electrode 30 while maintaining a high peak voltage necessary to ignite the plasma discharge. Additional elements may be incorporated to either reduce or boost the peak potential of electrode 30 as necessary to assure the ignition of the plasma discharge.

As soon as a plasma discharge is ignited, then it is possible for the induced electromagnetic fields within the metal vacuum chamber to drive a closed path AC electron drift currents 13 which are analogous to closed path AC electron drift currents encountered in other inductively coupled plasma source devices. As such this device is capable of sustaining a high power density electrode less plasma. It should be noted that, as with other inductively coupled plasma sources, one might be able to discern two modes of operation:

(1) a relatively low power density, low charged particle density mode associated with capacitively coupled fields and high AC voltages across plasma sheath boundaries, and (2) a relatively high power density, high charged particle density mode associated with inductively coupled fields and strong, closed path circulating AC currents through the bulk plasma discharge body.

The lower power density mode is characterized by weak AC plasma discharge currents 13 flowing through the openings of hollow vacuum chamber 1 that are typically on the order of several hundreds of milliamperes. These weak currents are driven by quasi-static electric field induced between the separate conductive boundaries of chambers 1 and 2. In contrast the higher power density mode is characterized by plasma discharge currents 13 flowing through the openings of vacuum chamber 1 that are typically on the order of several amperes to several tens of amperes. Depending upon the nature of the working gases, pressure range and disposition of input gas flow, the transition between modes (1) and (2) can appear as a discrete change in the plasma discharge current amplitude, or as a near contiguous change in plasma discharge current amplitude. It is typically desirable to immediately transition through the low power density mode upon striking the plasma discharge so as to sustain the high power density mode.

Figure 2:
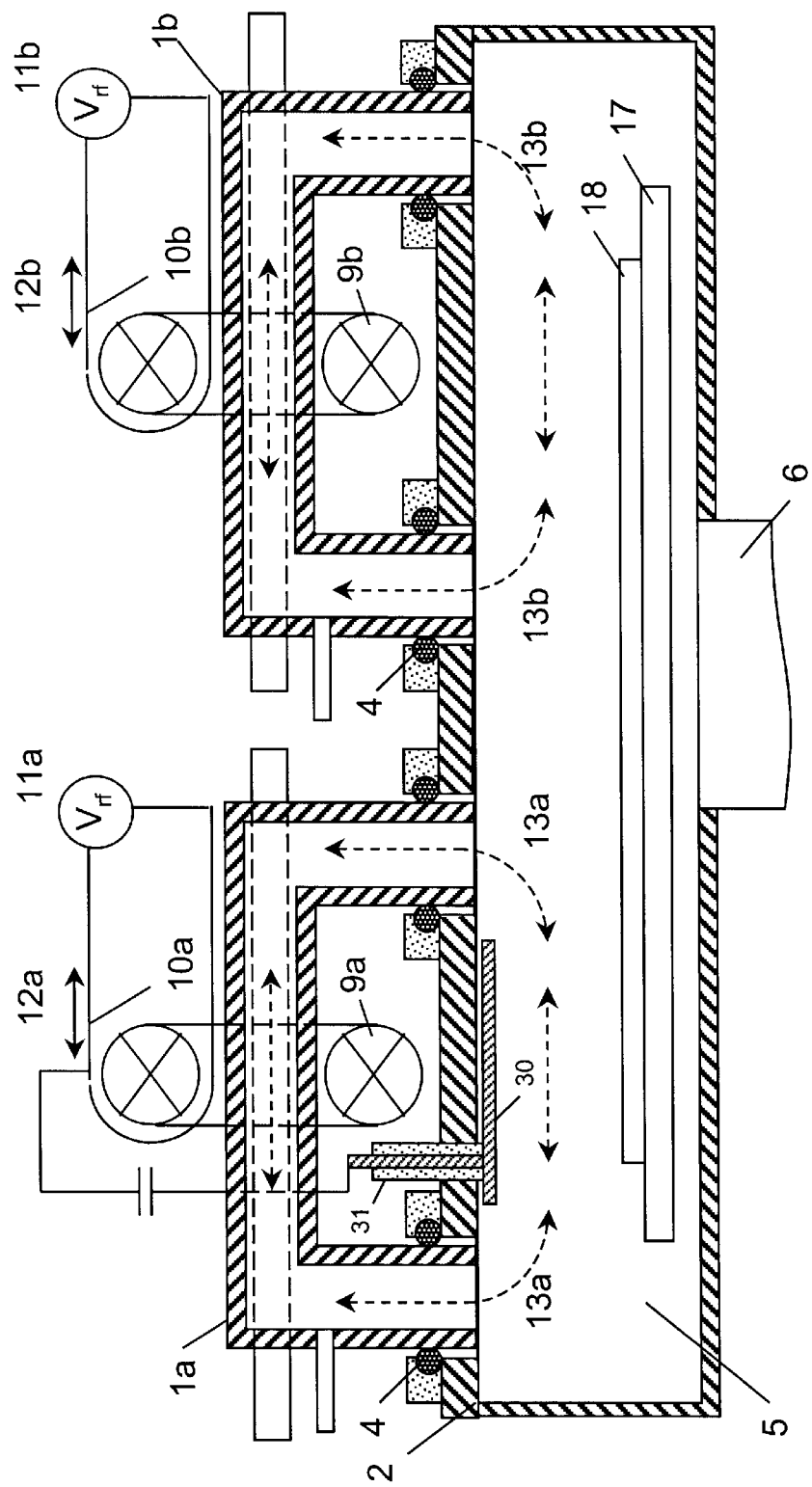
FIG. 2 illustrates an inductively coupled plasma source apparatus utilizing multiple transformer cores and fluid-cooled hollow metal vacuum chambers and embodiments in which circulating plasma currents driven through the hollow vacuum chambers are electrically operated in parallel.

FIG. 2 illustrates how two or more transformers associated with multiple hollow metal vacuum chambers 1a and 1b that are powered in parallel with separate primary current sources 12a and 12b can be applied to support multiple induced electron drift currents 13a and 13b within the vacuum plasma discharge region 5. The spatial properties of the plasma discharge, such as plasma potential, charged particle density, excited species concentration, may be managed by strategic spatial placement, scaling and operation of these multiple AC drift current distributions within the vacuum plasma discharge region 5. The principle illustrated shows how multiple hollow vacuum chambers may work together to power separate plasma-discharge currents that share a common plasma discharge processing region.

Figure 3:
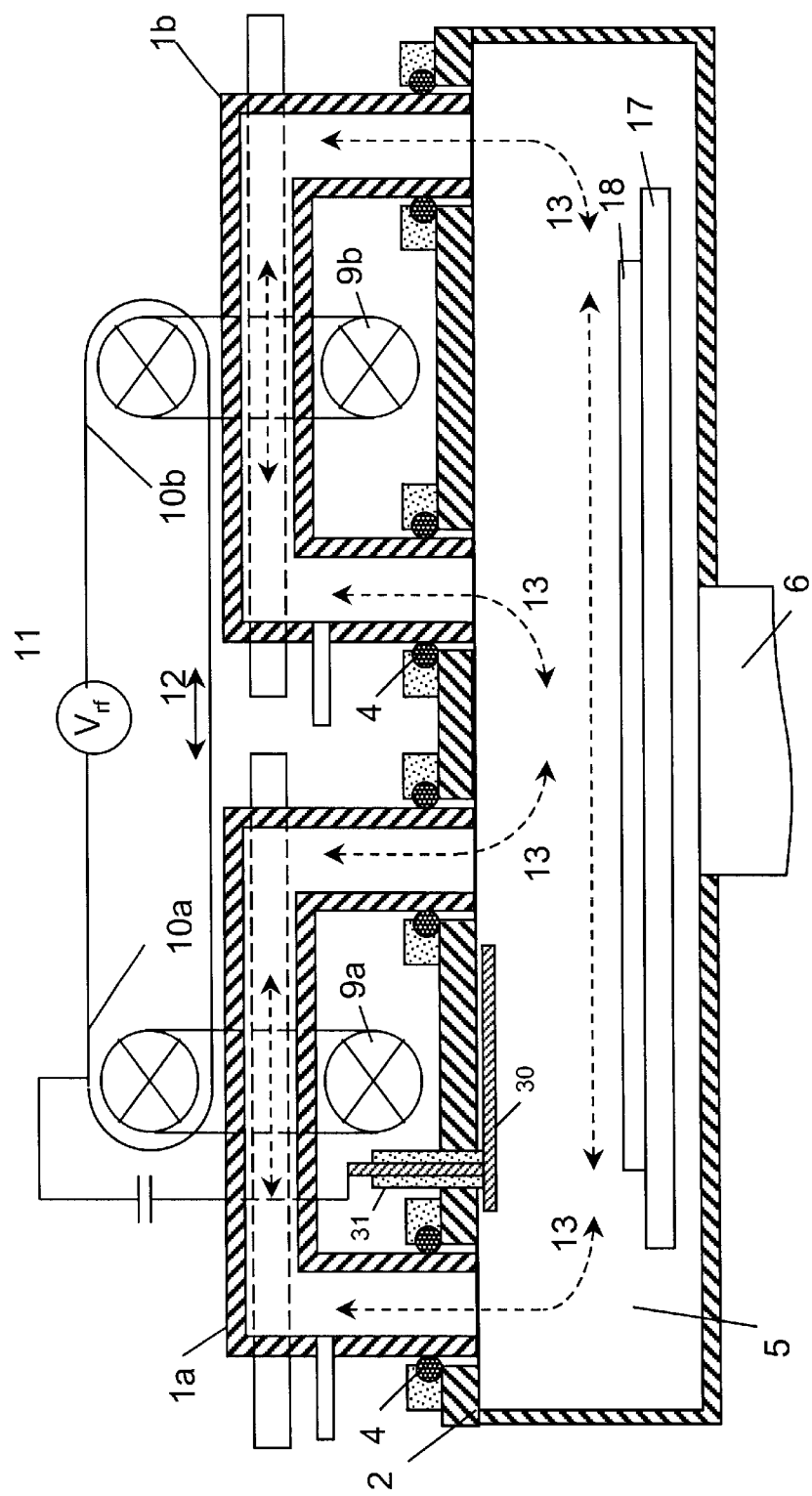
FIG. 3 illustrates an inductively coupled plasma source apparatus utilizing multiple transformer cores and fluid-cooled hollow metal vacuum chambers and embodiments in which continuous circulating plasma currents driven through the hollow vacuum chambers are electrically operated in series.

FIG. 3 illustrates how two or more transformers associated with multiple hollow metal vacuum chambers 1a and 1b that are powered in series with a single primary current source 12 can be applied to support a single electron drift current 13 within the vacuum plasma discharge region 5. The principle illustrated shows how multiple hollow vacuum chambers may work together to power a common plasma discharge current path within a shared plasma discharge processing region.

Figure 4:
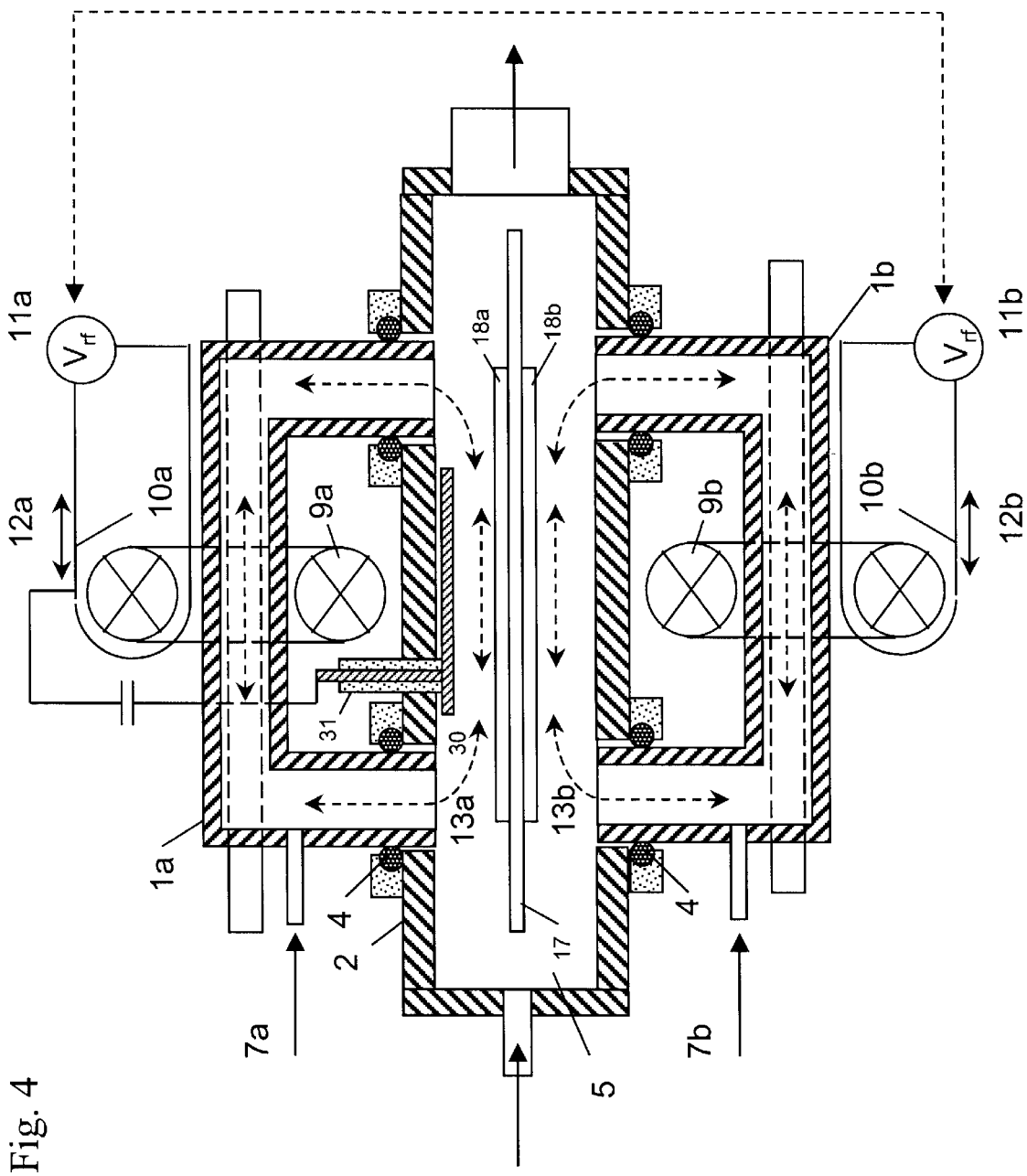
FIG. 4 illustrates an inductively coupled plasma source apparatus utilizing multiple transformer cores and fluid-cooled hollow metal vacuum chambers in which continuous circulating plasma currents driven through the hollow vacuum chambers are disposed and operated to process multiple sides of at least one substrate.

FIG. 4 illustrates how two or more transformers associated with multiple hollow metal vacuum chambers 1a and 1b that are powered in parallel by AC power sources 11a and 11b can be used to treat at least two sides of a single work piece 18 or to treat two sides of at least one work piece holder 17 upon which multiple work pieces 18a and 18b are mounted. The power sources 11a and 11b may be mutually or exclusively operated as dictated by the process needs and economy of the AC power supply circuit topology or method.

In some process applications, it is desirable to use a high power density plasma to chemically activate or alter the properties or composition of process gases. These chemically activated gaseous materials may then be transported to a primary vacuum process chamber or system. We identify these applications as "remote plasma source vacuum processing". Some examples of such applications include 1) remote chamber cleaning, 2) remote chamber ashing of polymer like surfaces, 3) downstream foreline cleaning and 4) post-process gas abatement within a vacuum foreline. Many of these applications involve high flows of electronegative plasma discharge gases (i.e. O2, NF3, SF6) and relatively high vacuum pressures, and therefore, often require high power densities in order to achieve high dissociation or conversion levels of feed gases. The present invention is well suited to these applications as the fluid cooled walls of the apparatus can extract the waste heat from the process vacuum chamber when high power levels are applied. Moreover, the plasma body of the present invention can fill the entire volume of hollow metal vacuum chambers and process vacuum chambers. This is in contrast to conventional ICP sources wherein the high vacuum pressure plasma discharge (>1 Torr) constricts to a relatively small volume due to the geometric constraints of the coil and natural ambipolar diffusion within a cylindrical plasma discharge cavity. As such flowing molecular gases within the present invention have relatively high residence time within the plasma body when compared to a conventional ICP source. Therefore, in principle, it is easier to achieve relatively higher dissociation and conversion levels of gaseous materials for a given power level with the within the inductively coupled plasma of the present invention when compared to conventional ICP sources.

Figure 5A:
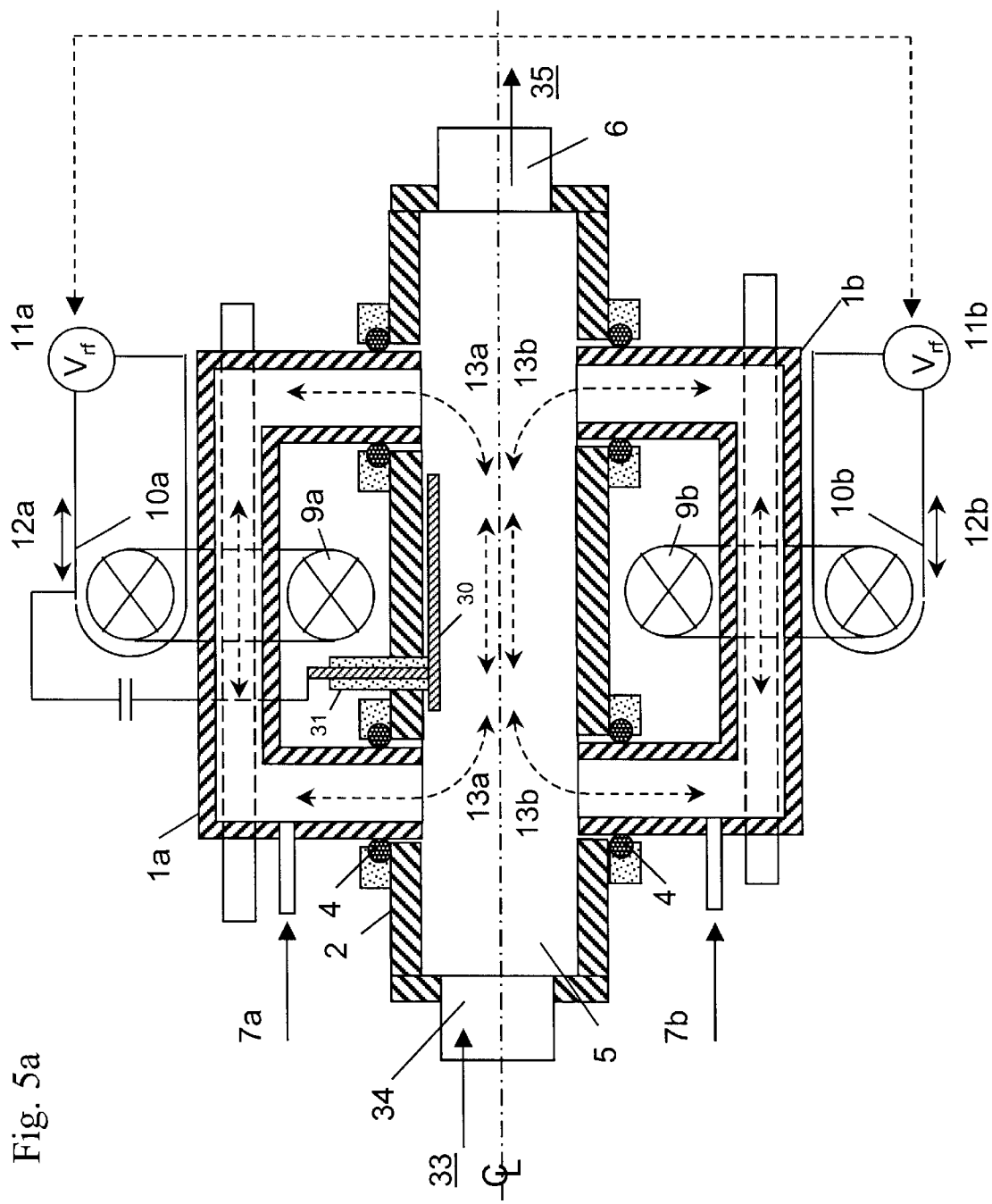
FIG. 5(a) and 5(b) illustrates an inductively coupled plasma source apparatus utilizing multiple transformer cores and fluid-cooled hollow metal vacuum chambers to form a continuous circulating plasma current within at least one common vacuum processing chamber.
Figure 5B:
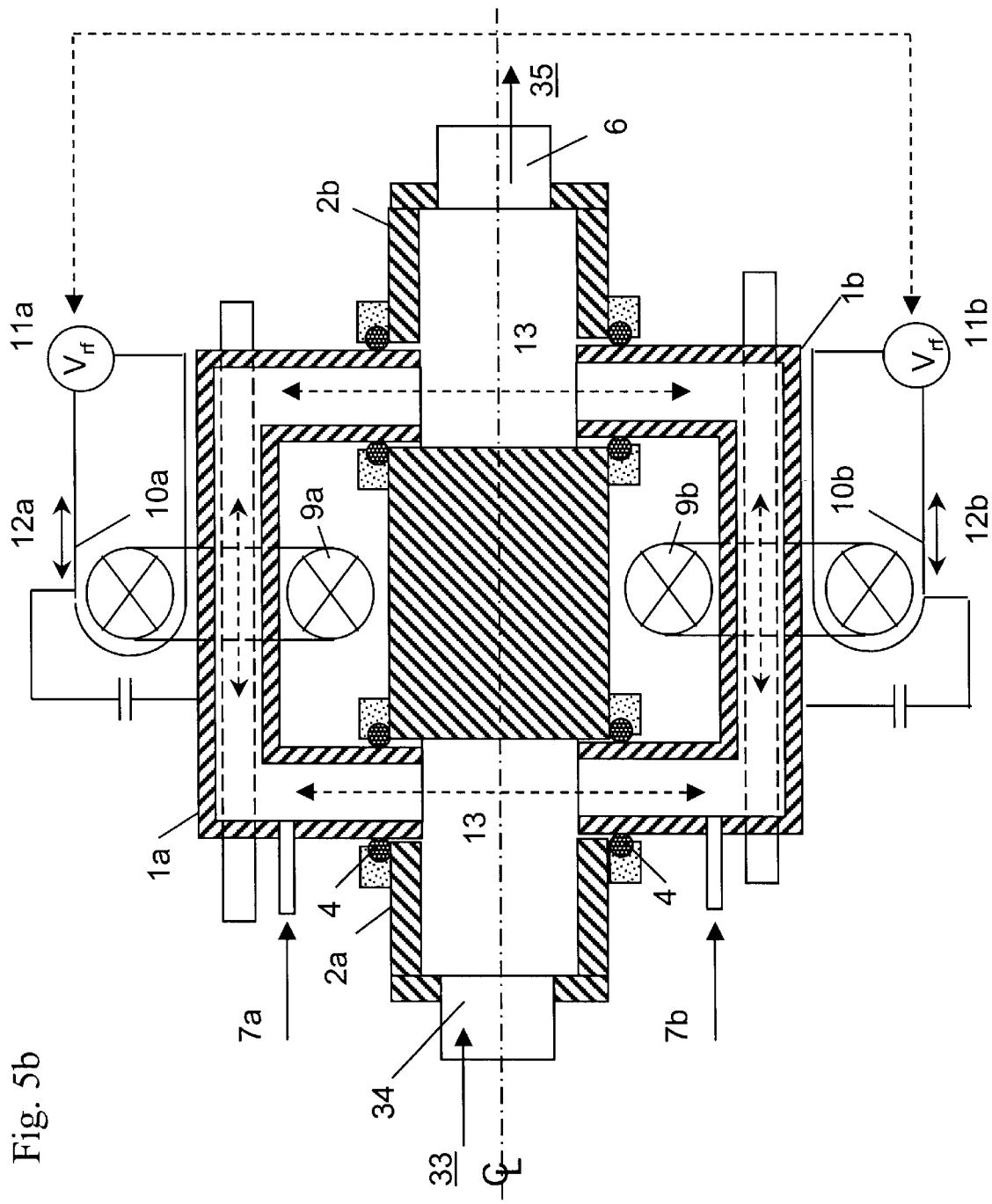

FIGS. 5a and 5b illustrates how the principles of the present invention can be used to chemically activate gaseous materials for remote plasma source vacuum gas processing. In this embodiment the end product is not a processed work piece, but are chemically active gaseous materials that have been generated in the process chamber by the plasma for the previously mentioned remote plasma source vacuum processing applications. In this adaptation, one or more hollow metal vacuum chambers 1a and 1b are disposed symmetrically about a single fluid-cooled foreline vacuum chamber 2, as shown in FIG. 5a, or may share multiple common vacuum chambers 2a and 2b, as shown in FIG. 5b.

When using a common process vacuum chamber as seen in FIG. 5a, working gases and/or post process gases 33 enter into the source through at least one entrance port 34 and through auxiliary gas feeds 7a and 7b in the hollow metal vacuum chambers 1a and 1b. The working gasses flow symmetrically through the hollow metal vacuum chambers 1a and 1b and the process vacuum chamber 2 and then combine and exit at the exhaust port 6. The hollow metal vacuum chambers 1a and 1b are used to form the plasma discharge drift currents 13a and 13b that constructively combine within the common vacuum chamber 2. In this manner, multiple hollow metal vacuum chambers and can be powered in such fashion so as to constructively enhance the power density within the common vacuum chamber 2 in order to achieve a very high-density plasma state at relatively high vacuum pressures (>1 Torr) for the purpose of chemically activating gaseous materials.

Alternatively, it may be desirable direct the flow of process gases through the hollow metal vacuum chambers 1a and 1b and process vacuum chamber 2a as illustrated in FIG. 5b. In this case working gases and/or post process gases 33 enter into the source through at least one entrance port 34 of an entrance vacuum chamber 2a and through auxiliary gas feeds 7a and 7b in the hollow metal vacuum chambers 1a and 1b. The working gasses flow symmetrically through the hollow metal vacuum chambers 1a and 1b and then combine within an exit vacuum chamber 2b that is connected to the exhaust port 6. The hollow metal vacuum chambers are used to form a common plasma discharge drift current 13 that circulates through the hollow metal vacuum chambers and end vacuum chambers in a series fashion. In this manner, multiple hollow metal vacuum chambers can constructively enhance the power density within the hollow metal vacuum chamber and end vacuum chamber assemblies in order to achieve a very high-density plasma state at relatively high vacuum pressures (>1 Torr) for the purpose of chemically activating gaseous materials. Note that in FIG. 5b that ignition of the plasma discharge is achieved by a capacitive connection $C_{ing}$ of the hollow metal vacuum chambers 1a and 1b to the AC power circuitry, rather than through a secondary electrode as illustrated in FIGS. 1–4 and 5a. The capacitive connection of $C_{ing}$ to the housing 1a or 1b defines a capacitively isolated electric boundary that is the outer boundary of the housings 1a and 1b.

The principles of the present invention may also be applied to the generation of broad area inductively coupled plasma discharges. FIG. 6a and 6b illustrate the application of several hollow metal vacuum chambers with transformer elements configured in an array so as to produce a broad area plasma discharge in a vacuum process region. Unlike conventional ICP sources, which make use of relatively expensive broad area ridged dielectric ports, domes, or plates, this novel configuration allows one to drive several plasma discharge current sources over a broad area vacuum process region that is nearly enclosed by all metal fluid cooled walls. Since the hollow metal vacuum chambers can be powered so as to form shared and/or mutually exclusive closed path plasma discharge currents, one may control the plasma discharge properties by adjusting the physical location and scale of the hollow metal vacuum chamber assemblies or the means by which they are collectively and/or separately powered.

FIG. 6a shows how four hollow metal vacuum chambers 36, 38, 40, and 42 may be incorporated into a broad area vacuum process chamber 44 assembly which may be powered in a series fashion to drive a plasma discharge current within the hollow metal vacuum chambers and process vacuum chamber in the manner hereinbefore described. Alternatively, FIG. 6b shows how the four hollow metal vacuum chambers may be incorporated into a broad area vacuum process chamber assembly which may be powered in a parallel fashion to drive mutually exclusive plasma discharge currents.

With these two illustrations in mind, modular hollow metal vacuum chamber assemblies with individual transformer elements may be powered as a phased array system of plasma current distributions to either statically or dynamically control the electron heating dynamics of a broad area plasma discharge apparatus. By application of these principles, a plasma apparatus employing multiple hollow metal vacuum chambers with any number of powering schemes to enhance or control the physical disposition of process plasma discharge characteristics (e.g. absorbed power density, electron density and energy distribution, diffusive chemistry distribution) and related measures of materials processing performance may be constructed.

Based on the proceeding illustrations, it is apparent to one of ordinary skill in the art that any combination or variant of the above embodiments of the present invention could include special coatings and wall materials per common vacuum processing practice to achieve the desired performance for processing materials or chemically activating gaseous materials. Such common practices include but are not limited to:

a) the use of chemical resistance coatings or platings on interior surfaces of the fluid-cooled metal vacuum walls of the apparatus, and b) the use of high temperature dielectric (i.e. quartz, alumina, boron-nitride, sapphire) liners to enhance the process performance, chemical resistance of the walls or transport or reactive gas by products.

Figure 7:
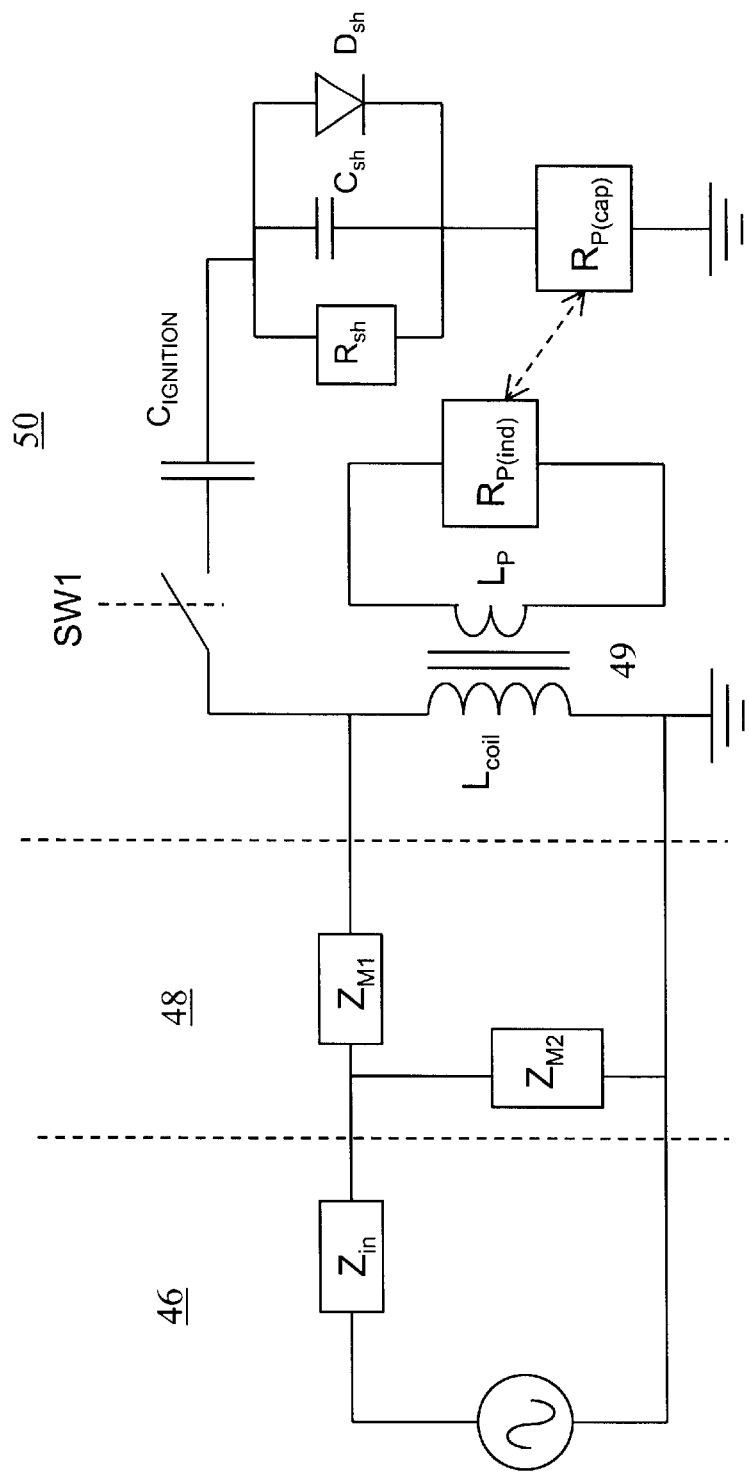
FIG. 7 illustrates an AC electrical circuit to power the inductively coupled plasma source apparatus utilizing multiple transformer cores and fluid-cooled hollow metal vacuum chambers, including generator, impedance network, induction circuit and starter circuit.

The electrical circuit used to power the plasma source apparatus is an important aspect of the present invention. A basic lumped-circuit parameter representation of one possible circuit to power at least one plasma loaded transformer element is shown in FIG. 7. The circuit is comprised of the AC power generator 46, the impedance matching element 48 and plasma loaded transformer 49 of the plasma source electrical system 50. The AC generator operates at a frequency well suited for driving electron-heating drift currents within the plasma source apparatus and appropriately selected for the scale of the apparatus, and choice of transformer core elements. This frequency is preferably, but not limited to, selected from frequencies between about 100 kHz and about 30 MHz for application of efficient and economic designs of the generator and selection of low loss impedance matching and transformer core elements. The power delivered from the generator may be at a fixed frequency or at a variable frequency and its amplitude may be continuous, dynamic in amplitude, pulsed or all of the above depending upon the needs of the process to which the apparatus is applied. The output impedance of the generator may be fixed, switched or continuously variable.

The network is typically comprised of passive reactive elements (e.g. inductors and capacitors), but may also include switching elements to discretely and/or dynamically change the network impedance elements as necessary to compensate for load impedance excursions of the plasma source apparatus. Depending upon the topology of the generator design, the impedance network may be incorporated into the generator, may be external to the generator, or may be incorporated into the electrically reactive features (i.e. leakage inductance and capacitance) of the transformer core and/or windings.

The impedance network element 48 is necessary to facilitate common process methods wherein dynamic impedance of the plasma-loaded transformer 49 varies in time due to desirable or necessary changes in gas pressure, flow and chemistry conditions during the process. In those configurations when the ac generator 46 has a fixed output impedance and is physically separate from the plasma source apparatus, the impedance network is necessary to translate the complex load impedance of the transformer to a range comparable to the ac generator output impedance such that the power delivered to the plasma may be adequately controlled even when the plasma impedance dynamically changes. In those configurations when the ac generator is a switch-mode ac supply that is integrated into the plasma source apparatus assembly, the impedance network is necessary to translate the dynamically changing and electrically complex load impedance of the plasma-loaded transformer to a near resistive value such that the switching devices of the ac power source may effectively control the power level with adequate zero-switch over capability and acceptable low insertion (i.e. dissipation) losses in the switches. In either case, the impedance network element 48 restricts or inhibits the power control capabilities of the ac power supply as needed for many common process methods.

As a specific example, workers may wish to ignite the source at low pressures with a gas with low ionization potential where it is relatively easy to ignite the discharge where the induced field required to sustain the plasma is relatively low (i.e. substantially less than 1 V/cm). Thereafter, they may wish to immediately transition to higher pressures or to a gas mixture where the induced field required to sustain plasma relatively high (i.e. substantially greater than 4 V/cm). Such a condition arises when demonstrating the operation of an apparatus similar to that depicted in 5b wherein the plasma source is ignited in Ar and then transitioned to pure $NF_3$ or $O_2$ at gas pressures on the order of a few Torr, the hollow metal vacuum chamber diameter is about 50 mm, the closed-path plasma current path length is on the order of about 40 cm, and the delivered power is about 3 kW or more. Under these conditions the plasma resistance, $R_P$, may vary by a factor of 10 or more. When integrating a frequency-variable ac switch-mode power supply with power leveling features as needed to accommodate the transition across the dynamic change in impedance, it is necessary to introduce an impedance network that is comprised of a capacitance, C, and inductance, L, (both not shown) in series with the plasma-loaded transformer form a resonant CLL circuit. The impedance network electrically translates the electrically complex load impedance range of the plasma-loaded transformer to an electrically resistive range of impedances at the terminals of the ac power supply. Provided that the impedance at the switch-mode power supply is nearly resistive in value, it is then possible to successfully control the power level output from the ac power supply with its frequency agile capabilities and with acceptable levels of switching losses. If the impedance network were removed from the apparatus, the desired power leveling capabilities could not be realized over the dynamic range in plasma resistance as the resulting switching losses would be unacceptably high and could result in damage to the switches within the ac switch-mode power supply.

The electrical circuit used to power the plasma source apparatus illustrated in FIG. 7 consists of a plasma-loaded transformer $L_c$ coupled to the plasma, which is represented as a single turn secondary. The transformer depicted in this illustration is a ferrite core, however it could be an air core transformer. The primary core windings have inductance $L_c$ and leakage capacitance $C_c$ (not shown). Ideally the transformer core and windings should have as little parasitic resistive loss as possible. The single-turn secondary winding impedance of the plasma is represented by inductance $L_P$ and resistance $R_{P(ind)}$. In principle there may be a capacitive component in the circuit that may be related to a capacitive connection to an internal electrode (refer to FIGS. 1–4 and 5a) or by a similar connection made to a hollow metal vacuum chamber body (refer to FIG. 5b). The capacitive components related to these plasma ignition features are represented by blocking capacitor $C_{ignition}$ and the RF sheath capacitance $C_{sh}$ sheath resistance $R_{SH}$ and capacitively-coupled plasma resistance $R_{P(cap)}$. Also it is possible to regulate the degree of capacitive coupling during either ignition or steady-state operation by means of a low capacitive switch, SW1. Since the plasma source may operate in either the weak power density mode (associated with capacitive coupling) or the high power density mode (associated with inductive coupling), the components representing capacitive plasma resistance, $R_{P(cap)}$, and induction resistance, $R_{P(ind)}$, may be mutually coupled as they are associated with the same body of charged carriers (electrons and ions) within the plasma.

Figures 8A, 8B:
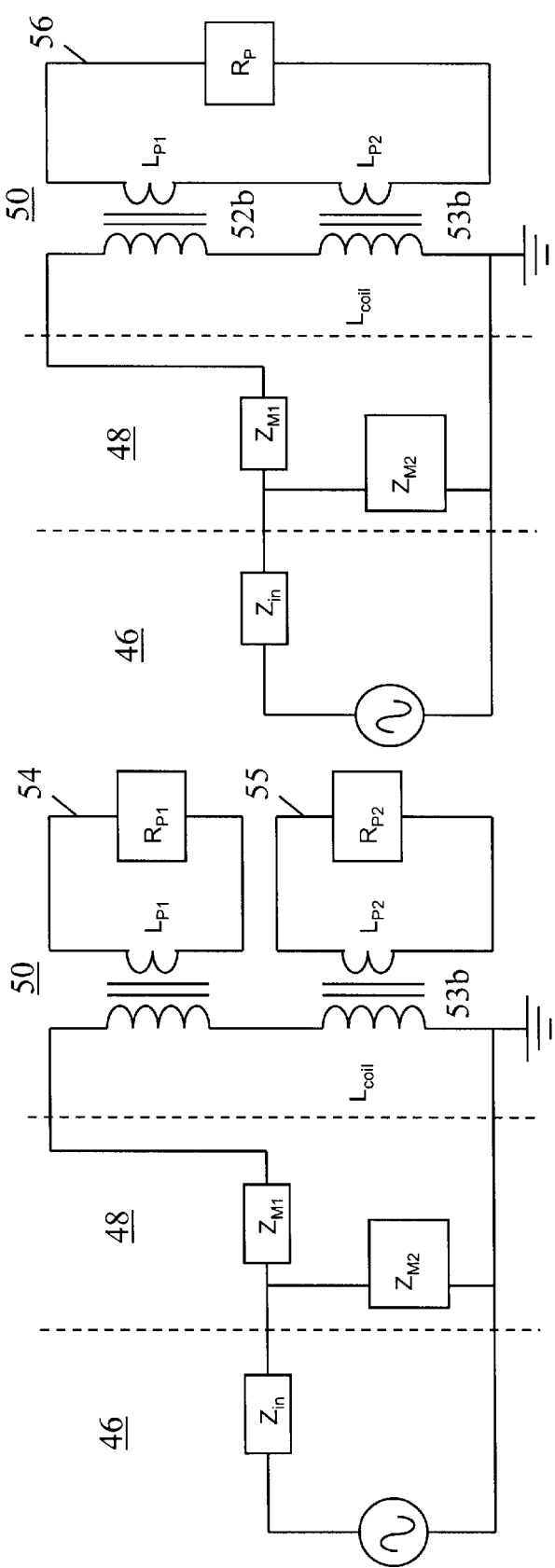
FIG. 8(a) illustrates an AC electrical circuit to power the inductively coupled plasma source apparatus transformer cores and fluid-cooled hollow metal vacuum chambers that are electrically driven in series with at least one AC power source and with independently coupled plasma discharge currents.
FIG. 8(b) illustrates an AC electrical circuit to power the inductively coupled plasma source apparatus utilizing multiple transformer cores and fluid-cooled hollow metal vacuum chambers that are electrically driven in parallel with at least one AC power source and with mutually coupled plasma discharge currents.

FIGS. 8a and 8b illustrate the manner in which multiple plasma-loaded transformers of the present invention may be powered by at least one AC generator. FIG. 8a depicts two plasma-loaded transformers assemblies 52a and 53a connected in series and powered through a single impedance matching network 48 and a single power supply 46. In this example, the closed-path plasma currents 54 and 55 associated with the two plasma-loaded transformers may be independent of one another or may be operated in a parallel fashion to deliver power to plasma resistances $R_{P1}$ and $R_{P2}$ as associated with plasma currents 54 and 55. Alternatively, FIG. 8b depicts a similar set of plasma-loaded transformers 52b and 53b connected in series and powered through a single impedance matching network 48 and a single power supply 46. The closed-path plasma current 56 that provides power to plasma resistance $R_P$ is common to the two plasma-loaded transformers.

Figure 9A:
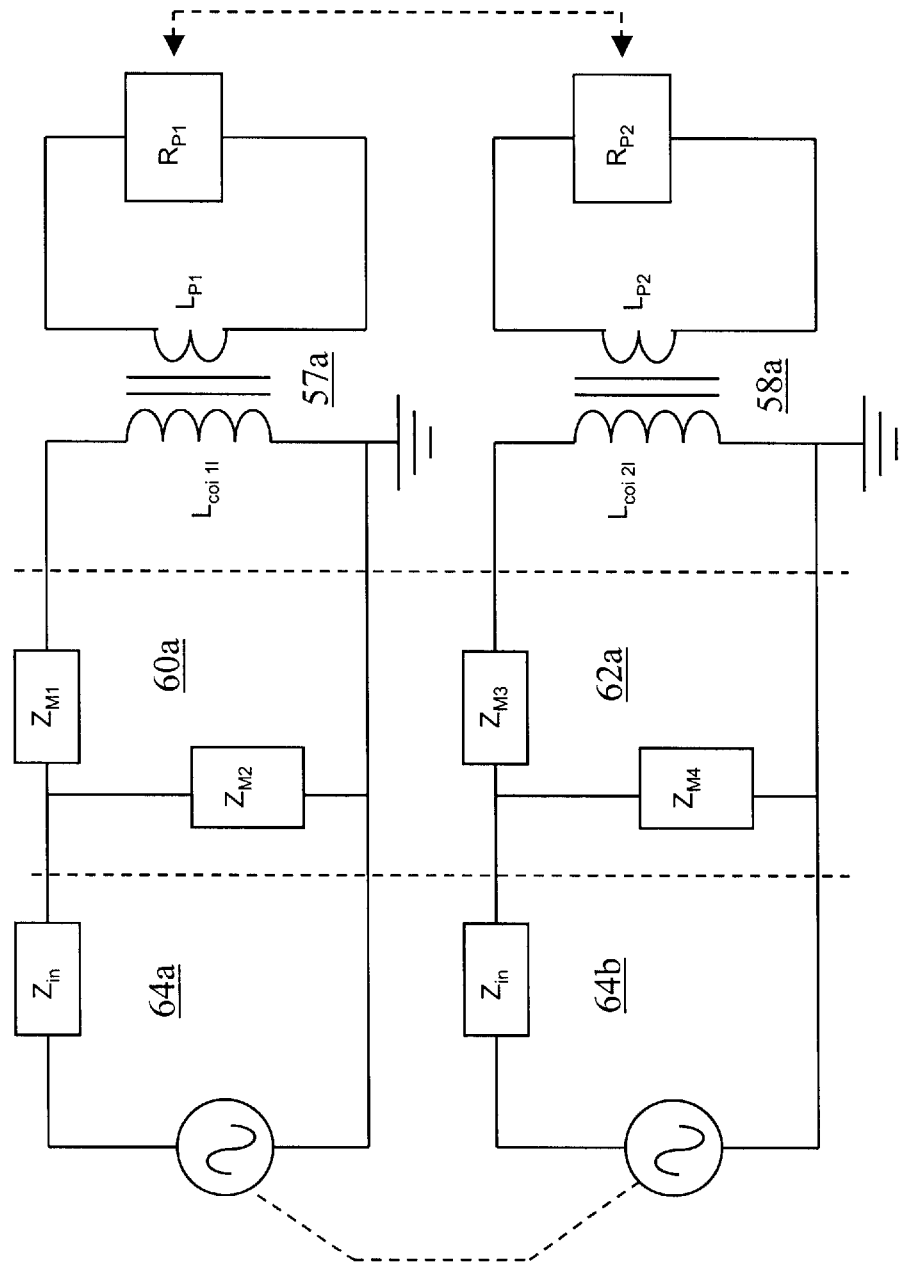
FIG. 9(a) illustrates an AC electrical circuit to power the inductively coupled plasma source apparatus utilizing multiple transformer cores and fluid-cooled hollow metal vacuum chambers that are electrically driven in parallel with separate a synchronously or synchronously controlled generators and impedance networks.
Figure 9B:
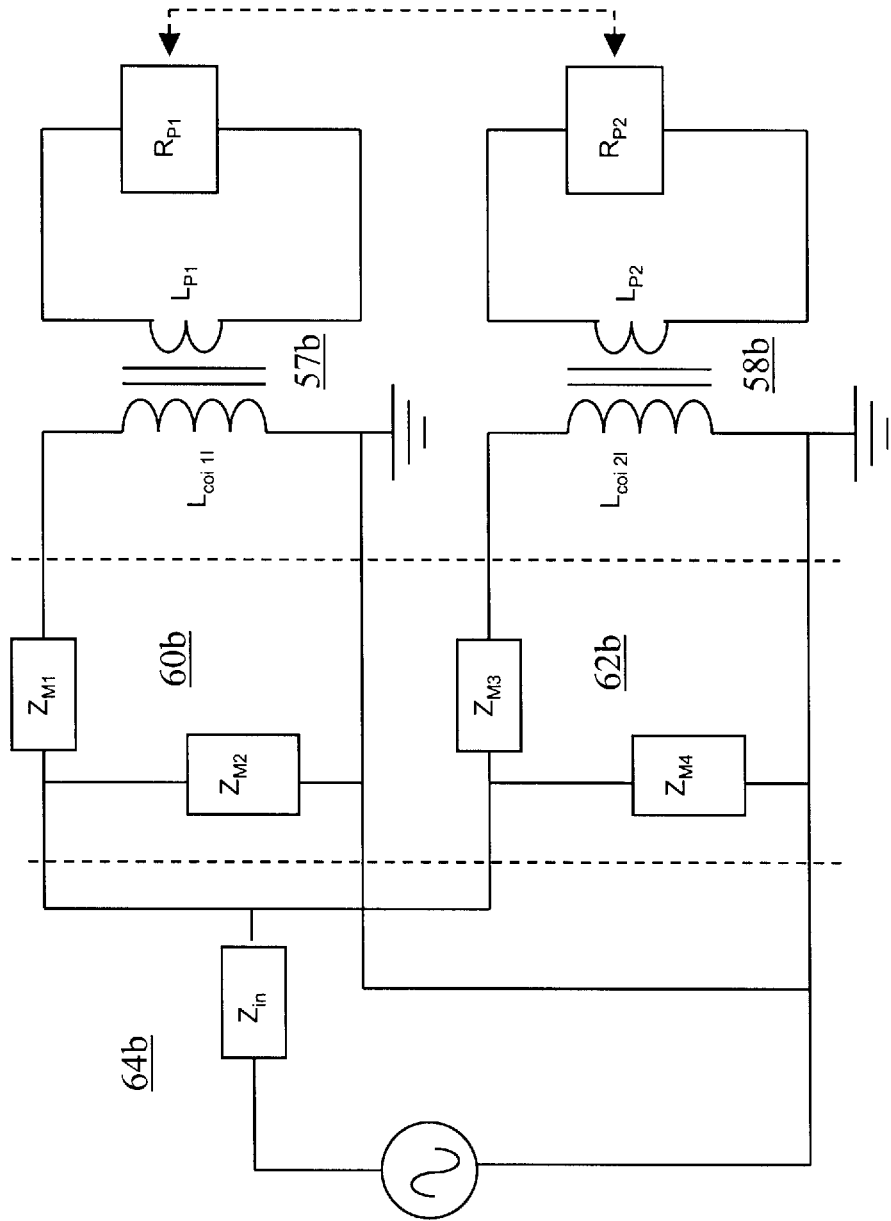
FIG. 9(b) illustrates an AC electrical circuit to power the inductively coupled plasma source apparatus utilizing multiple transformer cores and fluid-cooled hollow metal vacuum chambers that are electrically driven in parallel with a common generator with independent impedance networks.
Figure 9C:
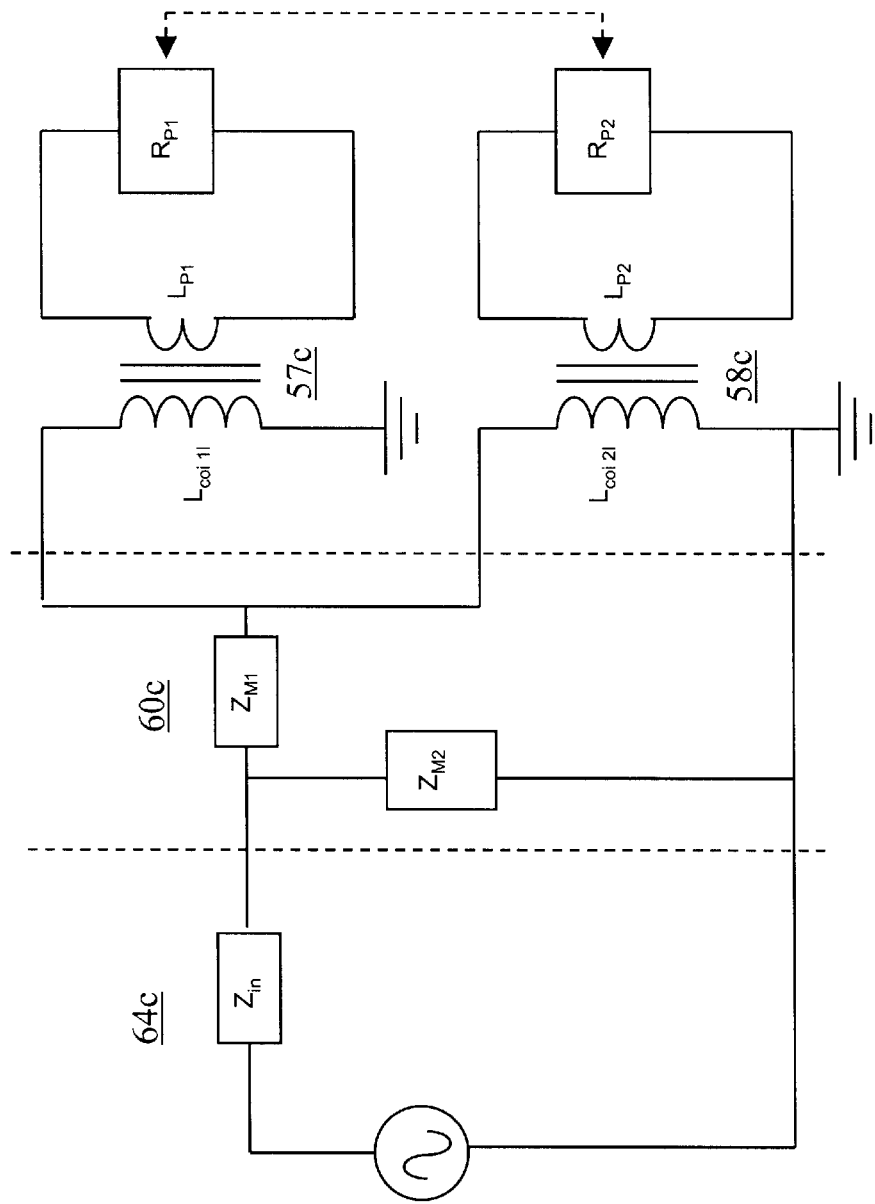
FIG. 9(c) illustrates an AC electrical circuit to power the inductively coupled plasma source apparatus utilizing multiple transformer cores and fluid-cooled hollow metal vacuum chambers that are electrically driven in parallel with a common generator with a common impedance network.

FIGS. 9a, 9b and 9c illustrate the manner in which multiple plasma loaded transformers associated with the present invention may be powered in a parallel fashion by at least one generator. FIG. 9a depicts two plasma-loaded transformers associated with the present invention 57a and 58a connected in parallel and powered through two separate impedance matching networks 60a and 62a and power supplies 64a and 66a. The power supplies may be operated a synchronously, synchronously or synchronously with controllable phase relationship to provide power into plasma resistances $R_{P1}$ and $R_{P2}$. FIG. 9b depicts two plasma-loaded transformers associated with the present invention 57b and 58b connected in parallel and powered by two separate impedance matching networks 60b and 62b and one common power supply 64b to provide power into plasma resistances $R_P$ and $R_{P2}$. Finally, FIG. 9c depicts two plasma-loaded transformers associated with the present invention 57c and 58c connected in parallel and powered by one common impedance matching network 60c and one common power supply 64c to provide power into plasma resistances $R_{P1}$ and $R_{P2}$. In all of three of these configurations, the closed path plasma current associated with the plasma loaded transformers as taught in the present invention may be independent of one another or may be operated in a parallel fashion to deliver power to RP1 and RP2. It is possible that RP1 and RP2 may be mutually coupled within the plasma body or vacuum process chamber.

Based on the proceeding illustrations, it is apparent to one of ordinary skill in the art that any combination or variant of electrical connections that have been illustrated above can be used in order to combine at least one power supply with at least one nominal AC frequency to power at least one plasma-loaded transformer in conjunction with at least one hollow metal vacuum chamber and at least one process vacuum chamber for the purpose of processing materials or chemically activating gaseous materials.

What we claim is:

1. An apparatus for plasma assisted processing of materials, comprising:
   a metal hollow chamber defining a vacuum chamber in communication with a metal processing chamber for plasma assisted processing of a work piece mounted on a platform positioned therein;
   a dielectric break between the hollow metal vacuum chamber and the metal processing chamber;
   an electrical transformer which is disposed about the hollow metal vacuum chamber and metal processing chamber having a primary coil so as to induce an electrical field in the vacuum chamber;
   a gas input for delivering a gas into the vacuum chamber for processing the work piece;
   a gas output for exhausting gases from the vacuum chamber;
   an AC power source connected to the primary winding of the electrical transformer for supplying power to the vacuum chamber to sustain a closed path plasma current that acts as the single-turn secondary current to the transformer and that flows within the vacuum chamber and extends into the metal processing chamber to form a plasma within the metal processing chamber; and
   the AC power source is connected to an impedance matching circuit to match the impedance range of the transformer to the output impedance range of the ac power source wherein the impedance matching network electrically translates the electrically complex load impedance range of the transformer to an electrically resistive range of impedances at the terminals of the ac power supply to minimize switching losses.

2. An apparatus for plasma assisted processing of materials as recited in claim 1 wherein a capacitively isolated electric boundary within the vacuum chamber is connected to the ac power source for the purpose of igniting a plasma within the vacuum chamber.

3. An apparatus for plasma assisted processing of materials as recited in claim 2 wherein the hollow metal vacuum chamber and the metal processing chamber are fluid cooled.

4. An apparatus for plasma assisted processing of materials as recited in claim 3 wherein the gas is selected from the group of gases consisting of: inert gases, reactive gases or mixtures thereof.

5. An apparatus for plasma assisted processing of materials as recited in claim 4 wherein the transformer includes a magnetic ferrite core.

6. An apparatus for plasma assisted processing of materials as recited in claim 5 wherein the ac power source is pulse modulated.

7. An apparatus for plasma assisted processing of materials as recited in claim 1 wherein the platform is electrically conductive.

8. An apparatus for plasma assisted processing of materials as recited in claim 7 wherein an electrical bias is applied to the platform and the mounted work piece.

9. An apparatus for plasma assisted processing of materials, comprising:
   multiple hollow metal chambers defining a vacuum chamber in communication with a metal processing chamber for plasma assisted processing of a work piece mounted on a platform positioned therein;
   at least one dielectric break between the hollow metal chambers and the metal processing chamber;
   each of the hollow metal chambers having an electrical transformer with a primary winding so as to induce and electric field within the vacuum chamber; a gas input for delivering a gas into the vacuum chamber for processing the work piece;
   a gas output for exhausting gases from the vacuum chamber;
   an AC power source connected to the primary winding of the electrical transformers for supplying power to the vacuum chamber to sustain closed path plasma currents that act as the single-turn secondary currents to the transformers and that flow in a parallel manner within the vacuum chamber.

10. An apparatus for plasma assisted processing of materials as recited in claim 9 wherein the ac power source is connected to an impedance matching circuit to match the impedance range of the transformers to the output impedance range of the ac power source.

11. An apparatus for plasma assisted processing of materials as recited in claim 10 wherein a capacitively isolated electric boundary within the vacuum chamber is connected to the ac power source for the purpose of igniting a plasma within the vacuum chamber.

12. An apparatus for plasma assisted processing of materials as recited in claim 11 wherein the hollow metal vacuum chambers and metal processing chamber are fluid cooled.

13. An apparatus for plasma assisted processing of materials as recited in claim 12 wherein the gas is selected from the group of gases consisting of: inert gases, reactive gases or mixtures thereof.

14. An apparatus for plasma assisted processing of materials as recited in claim 13 wherein the transformers include magnetic ferrite cores.

15. An apparatus for plasma assisted processing of materials as recited in claim 14 wherein of the ac power source is pulse modulated.

16. An apparatus for plasma assisted processing of materials as recited in claim 9 further comprising multiple ac power sources connected to an impedance matching circuit to match the impedance range of the transformners to the output impedance range of the ac power sources.

17. An apparatus for plasma assisted processing of materials as recited in claim 16 wherein the multiple ac power sources are operated synchronously.

18. An apparatus for plasma assisted processing of materials as recited in claim 16 wherein the multiple ac power sources are operated a synchronously.

19. An apparatus for plasma assisted processing of materials as recited in claim 9 wherein the platform is electrically conductive.

20. An apparatus for plasma assisted processing of materials as recited in claim 19 wherein an electrical bias is applied to the platform and the mounted work piece.

21. An apparatus for plasma assisted processing of materials as recited in claim 9 wherein the multiple hollow metal chambers are positioned on opposite sides of the processing chamber so as to treat opposite sides of a work piece mounted on the platform positioned therein.

22. An apparatus for plasma assisted processing of materials as recited in claim 9 wherein the multiple hollow metal chambers are positioned on opposite sides of the processing chamber so as to treat multiple work pieces mounted on opposite sides of the platform positioned therein.

23. An apparatus for plasma assisted processing of materials, comprising:
  multiple metal hollow metal vacuum chambers defining a vacuum chamber in communication with a metal processing chamber for plasma assisted processing of a work piece mounted on a platform positioned therein;
  at least one dielectric break between the metal hollow metal vacuum chambers and the metal processing chamber;
  each of the hollow metal chambers having an electrical transformer with a primary winding so as to induce a electric field within the vacuum chamber;
  a gas input for delivering a reactive gas into the vacuum chamber for processing the work piece;
  a gas output for exhausting reactive gases from the hollow metal vacuum chamber; and
  an AC power source connected to the primary windings of the electrical transformers for supplying power to the vacuum chamber to sustain closed path plasma currents that act as the single-turn secondary currents to the transformers and that flow in a series manner within the vacuum chamber.

24. An apparatus for plasma assisted processing of materials as recited in claim 23 wherein the ac power source is connected to an impedance matching circuit to match the impedance range of the transformers to the output impedance range of the ac power source.

25. An apparatus for plasma assisted processing of materials as recited in claim 24 wherein a capacitively isolated electric boundary within the vacuum chamber is connected to the ac power source for the purpose of igniting a plasma within the vacuum chamber.

26. An apparatus for plasma assisted processing of materials as recited in claim 25 wherein the hollow metal vacuum chambers and metal processing chamber are fluid cooled.

27. An apparatus for plasma assisted processing of materials as recited in claim 26 wherein the gas is selected from the group of gases consisting of: inert gases, reactive gases or mixtures thereof.

28. An apparatus for plasma assisted processing of materials as recited in claim 27 wherein the transformers include magnetic ferrite cores.

29. An apparatus for plasma assisted processing of materials as recited in claim 28 wherein of the ac power source is pulse modulated.

30. An apparatus for plasma assisted processing of materials as recited in claim 23 further comprising multiple ac power sources connected to an impedance matching circuit to match the impedance range of the transformers to the output impedance range of the ac power sources.

31. An apparatus for plasma assisted processing of materials as recited in claim 30 wherein the multiple ac power sources are operated synchronously.

32. An apparatus for plasma assisted processing of materials as recited in claim 30 wherein the multiple ac power sources are operated asynchronously.

33. An apparatus for plasma assisted processing of materials as recited in claim 23 wherein the platform is electrically conductive.

34. An apparatus for plasma assisted processing of materials as recited in claim 33 wherein an electrical bias is applied to the platform and the mounted work piece.

35. An apparatus for chemical activation of gaseous materials, comprising:
  a metal hollow chamber defining a vacuum chamber in communication with a metal processing chamber for plasma assisted chemical activation of gases disposed therein;
  a dielectric break between the hollow metal vacuum chamber and the metal processing chamber;
  an electrical transformer which is disposed about the hollow metal vacuum chamber and metal processing chamber having a primary coil so as to induce an electrical field in the vacuum chamber;
  a gas input for delivering a gas into the vacuum chamber for processing a work piece;
  a gas output for exhausting gases from the vacuum chamber;
  an AC power source connected to the primary winding of the electrical transformer for supplying power to the vacuum chamber to sustain a closed path plasma current that acts as the single-turn secondary current to the transformer and that flows within the vacuum chamber and extends into the metal processing chamber to form a plasma within the metal processing chamber;
  the AC power source is connected to an impedance matching circuit to match the impedance range of the transformer to the output impedance range of the ac power source wherein the impedance matching network electrically translates the electrically complex load impedance range of the transformer to an electrically resistive range of impedances at the terminals of the ac power supply to minimize switching losses; and
  a gas output wherein the output gas is a chemically activating gaseous material for remote plasma source vacuum gas processing.

36. An apparatus for plasma assisted processing of materials as recited in claim 35 wherein a capacitively isolated electric boundary within the vacuum chamber is connected to the ac power source for the purpose of igniting a plasma within the vacuum chamber.

37. An apparatus for plasma assisted processing of materials as recited in claim 36 wherein the hollow metal vacuum chamber and metal processing chamber are fluid cooled.

38. An apparatus for plasma assisted processing of materials as recited in claim 37 wherein the input gas is selected from the group of gases consisting of: inert gases, reactive gases or mixtures thereof.

39. An apparatus for plasma assisted processing of materials as recited in claim 38 wherein the transformer includes a magnetic ferrite core.

40. An apparatus for plasma assisted processing of materials as recited in claim 39 wherein of the ac power source is pulse modulated.

41. An apparatus for plasma assisted processing of materials as recited in claim 35 wherein the remote plasma source vacuum gas processing consists of remote chamber cleaning.

42. An apparatus for plasma assisted processing of materials as recited in claim 35 wherein the remote plasma source vacuum gas processing consists of remote chamber ashing of polymer like surfaces.

43. An apparatus for plasma assisted processing of materials as recited in claim 35 wherein the remote plasma source vacuum gas processing consists of downstream foreline cleaning.

44. An apparatus for plasma assisted processing of materials as recited in claim 35 wherein the remote plasma source vacuum gas processing consists of post-process gas abatement within a vacuum foreline.

45. An apparatus for chemical activation of gaseous materials, comprising:
  a metal hollow chamber defining a vacuum chamber in communication with multiple metal processing chambers for plasma assisted chemical activation of gases disposed therein;

at least one dielectric break between the metal hollow chamber and the multiple metal processing chambers;

each of the metal hollow chambers having an electrical transformer with a primary winding so as to induce an electric field within the vacuum chamber;

a gas input for delivering gases into the vacuum chamber;

a gas output for exhausting gases from the vacuum chamber;

an AC power source connected to the primary winding of the electrical transformers for supplying power to the vacuum chamber to sustain closed path plasma current that acts as the single-turn secondary current to the transformers and that flows through the hollow metal chambers and metal housings in a series manner; and a gas output wherein the output gas is a chemically activating gaseous material for remote plasma source vacuum gas processing.

46. An apparatus for plasma assisted processing of materials as recited in claim 45 wherein the ac power source is connected to an impedance matching circuit to match the impedance range of the plasma loaded transformer to the output impedance range of the ac power source.

47. An apparatus for plasma assisted processing of materials as recited in claim 46 wherein a capacitively isolated electric boundary within the vacuum chamber is connected to the ac power source for the purpose of igniting a plasma within the vacuum chamber.

48. An apparatus for plasma assisted processing of materials as recited in claim 47 wherein the metal hollow vacuum chambers and metal processing chamber are fluid cooled.

49. An apparatus for plasma assisted processing of materials as recited in claim 48 wherein the gas is selected from the group of gases consisting of: inert gases, reactive gases or mixtures thereof.

50. An apparatus for plasma assisted processing of materials as recited in claim 49 wherein the transformer includes a magnetic ferrite core.

51. An apparatus for plasma assisted processing of materials as recited in claim 50 wherein of the ac power source is pulse modulated.

52. An apparatus for plasma assisted processing of materials as recited in claim 45 further comprising multiple ac power sources are connected to an impedance matching circuit to match the impedance range of the transformers to the output impedance range of the ac power sources.

53. An apparatus for plasma assisted processing of materials as recited in claim 52 wherein the multiple ac power sources are operated synchronously.

54. An apparatus for plasma assisted processing of materials as recited in claim 52 wherein the multiple ac power sources are operated a synchronously.

55. An apparatus for plasma assisted processing of materials as recited in claim 45 wherein the remote plasma source vacuum gas processing consists of remote chamber cleaning.

56. An apparatus for plasma assisted processing of materials as recited in claim 45 wherein the remote plasma source vacuum gas processing consists of remote chamber ashing of polymer like surfaces.

57. An apparatus for plasma assisted processing of materials as recited in claim 45 wherein the remote plasma source vacuum gas processing consists of downstream foreline cleaning.

58. An apparatus for plasma assisted processing of materials as recited in claim 45 wherein the remote plasma source vacuum gas processing consists of post-process gas abatement within a vacuum foreline.

* * * * *